(12) United States Patent
Wang

(10) Patent No.: US 9,502,637 B2
(45) Date of Patent: Nov. 22, 2016

(54) PIEZOELECTRIC MATERIAL, PIEZOELECTRIC ELEMENT, LIQUID EJECTING HEAD, LIQUID EJECTING APPARATUS, AND ULTRASONIC MEASURING APPARATUS

(71) Applicant: Seiko Epson Corporation, Tokyo (JP)

(72) Inventor: Xiaoxing Wang, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/730,665

(22) Filed: Jun. 4, 2015

(65) Prior Publication Data
US 2015/0357553 A1 Dec. 10, 2015

(30) Foreign Application Priority Data
Jun. 5, 2014 (JP) ................. 2014-117102

(51) Int. Cl.
| | |
|---|---|
| B41J 2/045 | (2006.01) |
| H01L 41/187 | (2006.01) |
| H01L 41/113 | (2006.01) |
| B41J 2/14 | (2006.01) |
| B41J 2/16 | (2006.01) |
| H01L 41/08 | (2006.01) |
| H01L 41/09 | (2006.01) |
| H01L 41/318 | (2013.01) |

(52) U.S. Cl.
CPC ........ *H01L 41/1878* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1635* (2013.01); *B41J 2/1642* (2013.01); *B41J 2/1646* (2013.01); *H01L 41/0815* (2013.01); *H01L 41/0973* (2013.01); *H01L 41/1132* (2013.01); *B41J 2002/14241* (2013.01); *B41J 2002/14419* (2013.01); *B41J 2002/14491* (2013.01); *H01L 41/318* (2013.01)

(58) Field of Classification Search
None
See application file for complete search history.

(56) References Cited

U.S. PATENT DOCUMENTS

| | | | |
|---|---|---|---|
| 2003/0134738 A1* | 7/2003 | Furukawa | C04B 35/462 501/135 |
| 2009/0230211 A1 | 9/2009 | Kobayashi et al. | |
| 2011/0007115 A1* | 1/2011 | Kobayashi | B41J 2/14233 347/68 |
| 2012/0117770 A1 | 5/2012 | Sakai | |
| 2013/0258000 A1* | 10/2013 | Ohashi | B41J 2/1629 347/71 |
| 2014/0292160 A1 | 10/2014 | Kubota et al. | |

FOREIGN PATENT DOCUMENTS

| | | |
|---|---|---|
| JP | 2009-242229 A | 10/2009 |
| JP | 2009-252789 A | 10/2009 |
| JP | 2010-053422 A | 3/2010 |
| JP | 2010-214841 A | 9/2010 |
| JP | 2011-035385 A | 2/2011 |
| JP | 2012-109361 A | 6/2012 |
| JP | 2014-209616 A | 11/2014 |

* cited by examiner

*Primary Examiner* — Erica Lin
(74) *Attorney, Agent, or Firm* — Harness, Dickey & Pierce, P.L.C.

(57) ABSTRACT

A piezoelectric material is expressed as a mixed crystal including a first component formed of a complex oxide having a perovskite structure and a rhombohedral structure and containing Bi in an A-site and Fe in a B-site, a second component formed of a complex oxide having a perovskite structure and a tetragonal structure and containing Ba in an A-site and Ti in a B-site, and a third component formed of a complex oxide having a perovskite structure and a tetragonal structure and containing Bi and K in an A-site and Ti in a B-site.

14 Claims, 12 Drawing Sheets

FIG. 6
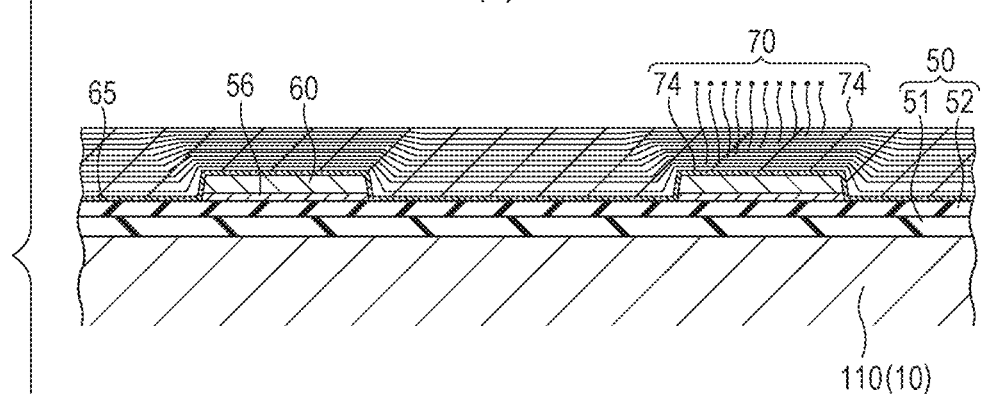
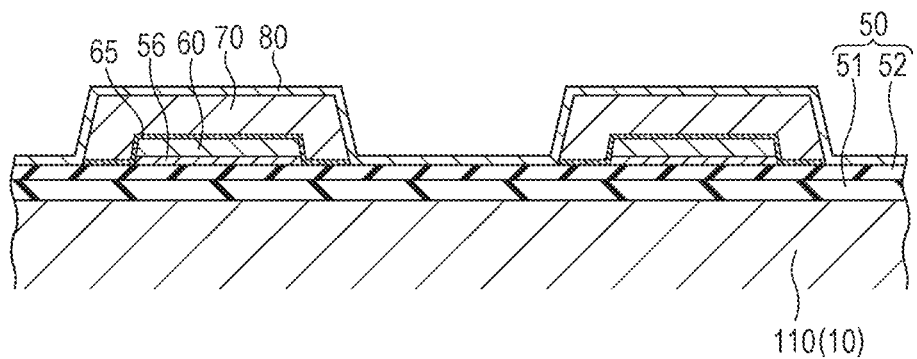

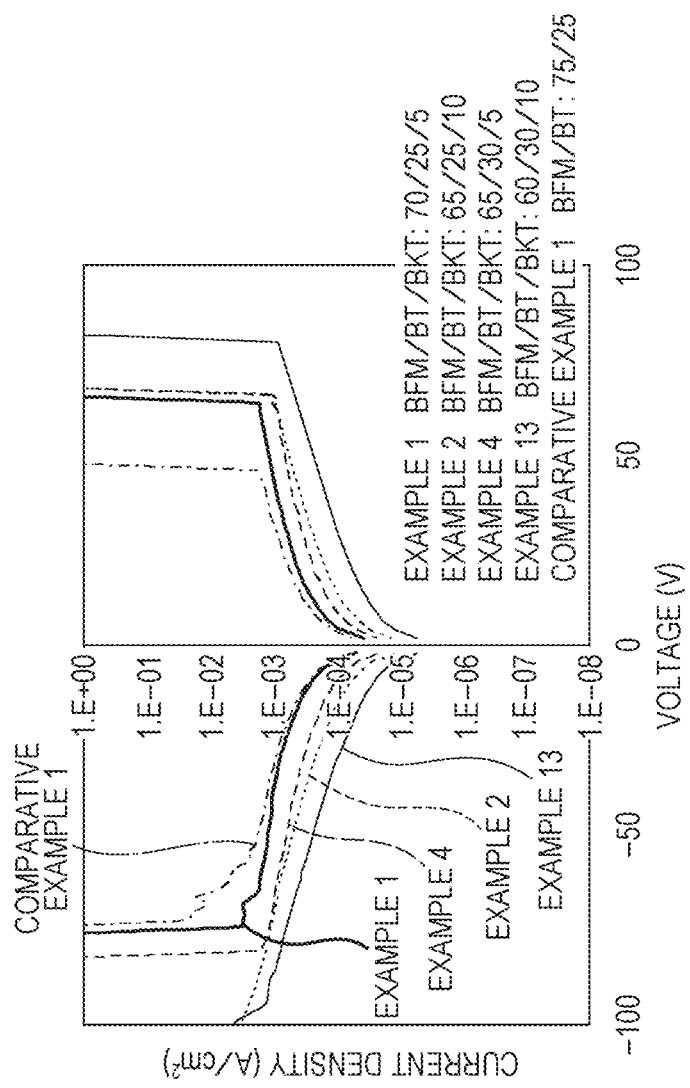

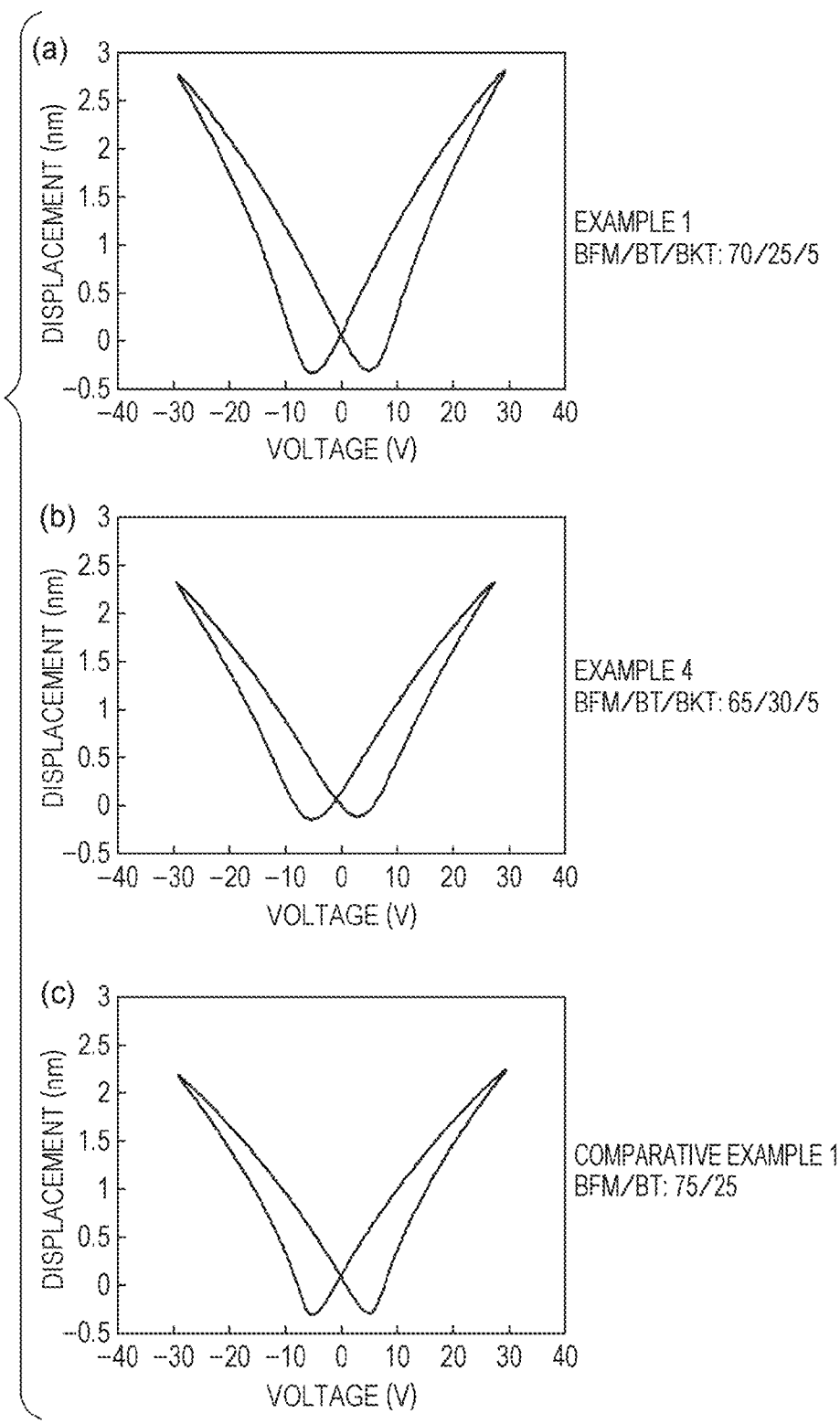

PIEZOELECTRIC MATERIAL, PIEZOELECTRIC ELEMENT, LIQUID EJECTING HEAD, LIQUID EJECTING APPARATUS, AND ULTRASONIC MEASURING APPARATUS

TECHNICAL FIELD

The present invention relates to a piezoelectric material, a piezoelectric element, a liquid ejecting head, a liquid ejecting apparatus, and an ultrasonic measuring apparatus.

BACKGROUND

Hitherto, piezoelectric elements have had a configuration in which a piezoelectric layer made of a piezoelectric material having an electromechanical conversion function is placed between two electrodes. Piezoelectric elements are mounted on liquid ejecting heads or liquid ejecting apparatuses as, for example, a flexure-mode actuator device and are also widely used in ultrasonic measuring apparatuses, various motors, sensors, memory devices and the like. The piezoelectric material constituting the piezoelectric layer of the piezoelectric element is required to have excellent displacement characteristics, and lead zirconate titanate (PZT) is known as a representative example. However, the development of a piezoelectric material in which the content of lead is suppressed has advanced from the viewpoint of a reduction in an environmental load.

For example, a piezoelectric material which is formed of a mixed crystal of $Bi(Fe,Mn)O_3$ and $Ba(Zr,Ti)O_3$ and expressed by composition formula $(1-x)Bi(Fe_{1-y}Mn_y)O_3-xBa(Zr_uTi_{1-u})O_3$ where $0<x<0.40$, $0.01<y<0.10$, and $0 \leq u < 0.16$ is proposed (for example, see JP-A-2009-252789).

However, in a piezoelectric material in which the content of lead is suppressed as in JP-A-2009-252789, it is difficult to suppress a leak current when a predetermined kind of metal is diffused in the electrode. Thus, in recent years in which a further increase in density and performance has been required for liquid ejecting heads, a piezoelectric material capable of reducing a leak current and also enhancing displacement characteristics has been required. Such a problem is also present not only in piezoelectric materials constituting piezoelectric layers of piezoelectric elements used in liquid ejecting heads, but also in piezoelectric materials constituting piezoelectric layers of piezoelectric elements mounted on other apparatuses including ultrasonic measuring apparatuses.

An object of the invention is to provide a piezoelectric material, a piezoelectric element, a liquid ejecting head, a liquid ejecting apparatus, and an ultrasonic measuring apparatus in which the leak current can be reduced and displacement characteristics can also be enhanced in view of the circumstances.

SUMMARY

According to an aspect of the invention solving the above-mentioned problem, there is provided a piezoelectric material which is expressed as a mixed crystal including a first component formed of a complex oxide having a perovskite structure and a rhombohedral structure and containing Bi in an A-site and Fe in a B-site, a second component formed of a complex oxide having a perovskite structure and a tetragonal structure and containing Ba in an A-site and Ti in a B-site, and a third component formed of a complex oxide having a perovskite structure and a tetragonal structure and containing Bi and K in an A-site and Ti in a B-site.

According to the aspect, a piezoelectric material in which the second component is substituted with the third component is provided. Since the substitution is performed between the complex oxides having a tetragonal structure, the composition ratio of the piezoelectric material is adjusted without greatly changing the overall crystalline structure, and an improvement in displacement and a reduction in leak current can be achieved. A lattice distortion is generated by introducing the third component, and displacement characteristics can be improved by adjusting the composition ratio in a morphotropic phase boundary (MPB) region of the piezoelectric material. In addition, when the content of a predetermined kind of metal (for example, Fe) in the first component is relatively reduced by introducing the third component, the generation of cations (for example, $Fe^{2+}$) which may be a cause of a leak current can be suppressed, and thus the leak current can be reduced. Moreover, the load on the environment can also be reduced by suppressing the content of lead.

Here, it is preferable that the first component has a composition expressed by the following Formula (1) with Mn contained in the B-site, the second component has a composition expressed by the following Formula (2), and the third component has a composition expressed by the following Formula (3).

$$Bi(Fe,Mn)O_3 \quad (1)$$

$$BaTiO_3 \quad (2)$$

$$(Bi,K)TiO_3 \quad (3)$$

According to this, charges of a predetermined kind of metal (for example, $Fe^{3+}$) are stabilized with Ti in $(Bi,K)TiO_3$ which is the third component, and the generation of cations (for example, $Fe^{2+}$) which may be a cause of a leak current is further suppressed with Mn further contained in the first component. Thus, the leak current can be further reduced.

Further, it is preferable that the molar ratio (rhombohedral crystal/tetragonal crystal) of the complex oxide having a rhombohedral structure in the first component to the total complex oxides having a tetragonal structure in the second and third components is 75/25 to 55/45. According to this, since a piezoelectric material is provided in which a part of the complex oxide having a tetragonal structure in the second component is appropriately substituted with the third component having the same tetragonal structure, the composition ratio is easily adjusted in the MPB region of the piezoelectric material, and thus displacement characteristics are easily improved.

Further, it is preferable that, the content of the second component is 25 mol % to 35 mol %. According to this, the abundance of the complex oxide of the first component having a perovskite structure is secured. Therefore, the complex oxide of the second component having a tetragonal structure is appropriately substituted with the third component to easily achieve an improvement in displacement and a reduction in leak current without greatly changing the overall crystalline structure.

Further, it is preferable that, the content of the third component is 5 mol % to 20 mol %. According to this, the composition ratio is easily adjusted in the MPB region of the piezoelectric material, and thus displacement characteristics are easily improved.

According to another aspect of the invention solving the above-mentioned problem, there is provided a first electrode, a piezoelectric layer made of any one of piezoelectric materials described above, and a second electrode are stacked on a substrate. According to the aspect, the leak current can be reduced and displacement characteristics can also be enhanced. Moreover, the load on the environment can also be reduced by suppressing the content of lead.

Here, it is preferable that the piezoelectric layer is stacked on the first electrode via a seed layer formed of a complex oxide having a perovskite structure and containing Bi in an A-site and Mn in a B-site. According to this, a piezoelectric layer preferentially oriented to, for example, a (100) plane can be obtained with the orientation control function of the seed layer. Accordingly, the leak current can be further reduced and displacement characteristics can also be easily enhanced.

According to still another aspect of the invention, there is provided a liquid ejecting head including the above described piezoelectric element. According to the aspect, the leak current can be reduced and displacement characteristics can also be enhanced. Thus, a liquid ejecting head in which ejection characteristics can be improved is provided. Moreover, the load on the environment can also be reduced by suppressing the content of lead.

According to still another aspect of the invention, there is provided an ultrasonic measuring apparatus including: the above-described piezoelectric element; and control means for measuring a subject using a signal based on at least one of an ultrasonic wave transmitted by the piezoelectric element and an ultrasonic wave received by the piezoelectric element. According to the aspect, the leak current can be reduced and displacement characteristics can also be enhanced. Thus, a liquid ejecting apparatus in which ejection characteristics can be improved is provided. Moreover, the load on the environment can also be reduced by suppressing the content of lead.

According to a still another aspect of the invention, there is provided an ultrasonic measuring apparatus including: the piezoelectric element described above; and control means for measuring a subject using a signal based on at least one of an ultrasonic wave transmitted by the piezoelectric element and an ultrasonic wave received by the piezoelectric element. According to the aspect, the leak current can be reduced and displacement characteristics can also be enhanced. Thus, an ultrasonic measuring apparatus in which ultrasonic wave transmission and reception characteristics can be improved is provided. Moreover, the load on the environment can also be reduced by suppressing the content of lead.

BRIEF DESCRIPTION OF DRAWINGS

FIG. 6 shows cross-sectional views showing an example of the manufacturing of the recording head according to Embodiment 1.

FIG. 11 is a diagram showing current (I)-voltage (V) characteristics in the examples and the comparative example.

FIG. 12 shows diagrams showing DBLI displacement measurement results in the examples and the comparative example.

DETAILED DESCRIPTION

Embodiment 1

Figure 1:
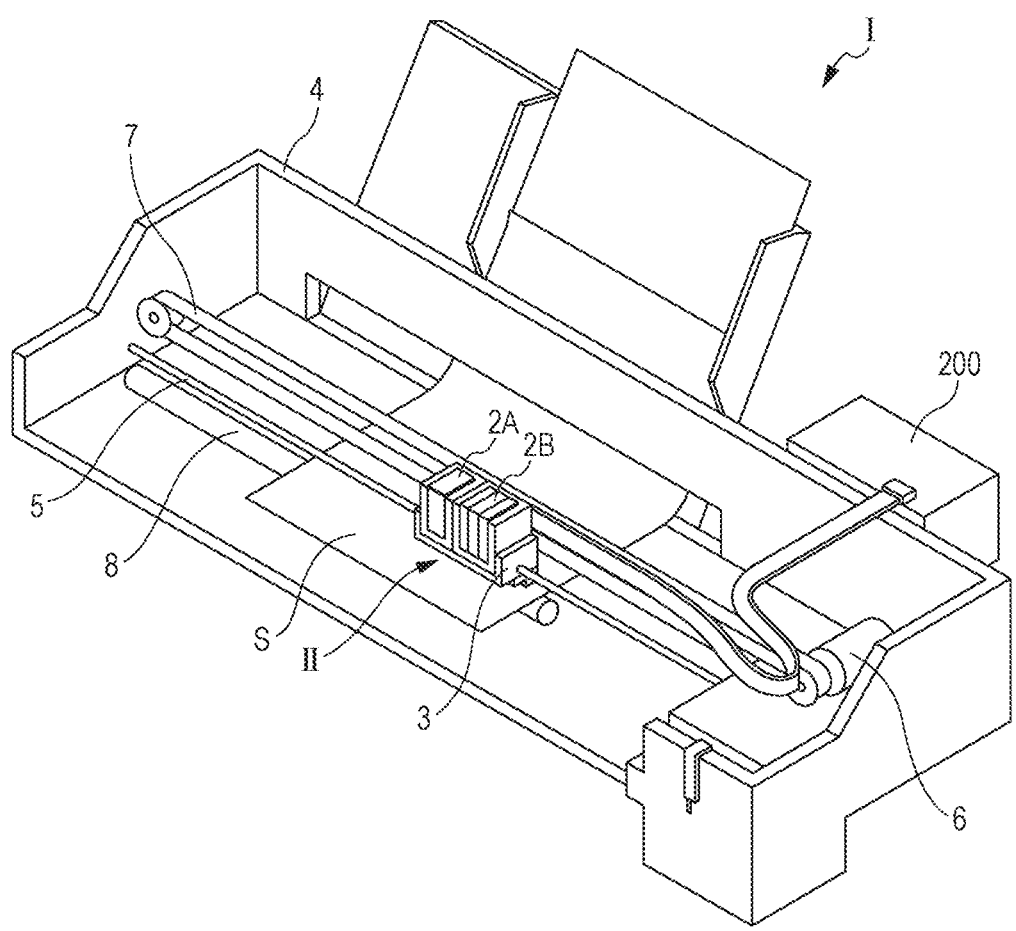
FIG. 1 is a diagram showing a schematic configuration of a recording apparatus according to Embodiment 1.

FIG. 1 shows an ink jet recording apparatus which is an example of a liquid ejecting apparatus according to Embodiment 1 of the invention.

As shown in the drawing, in an ink jet recording apparatus I, an ink jet recording head unit (head unit) II having a plurality of ink jet recording heads is detachably provided on cartridges 2A and 2B constituting ink supply means. A carriage 3 having the head unit II mounted thereon is provided on a carriage shaft 5 attached to an apparatus main body 4 so as to be movable in a shaft direction, and discharges, for example, a black ink composition and color ink compositions.

The carriage 3 having the head unit II mounted thereon is moved along the carriage shaft 5 by the transfer of the driving force of a driving motor 6 to the carriage 3 via a plurality of toothed wheels (not shown) and a timing belt 7. In the apparatus main body 4, a transport roller 8 is provided as transport means and a recording sheet S which is a recording medium such as paper is transported by the transport roller 8. The transport means for transporting a recording sheet S is not limited to the transport roller, and may be a belt, a drum, or the like.

According to this ink jet recording apparatus I, since the ink jet recording heads according to this embodiment are mounted, the leak current can be reduced and displacement characteristics can also be enhanced. Thus, ejection characteristics can be improved. Moreover, the load on the environment can also be reduced by suppressing the content of lead.

Figure 2:
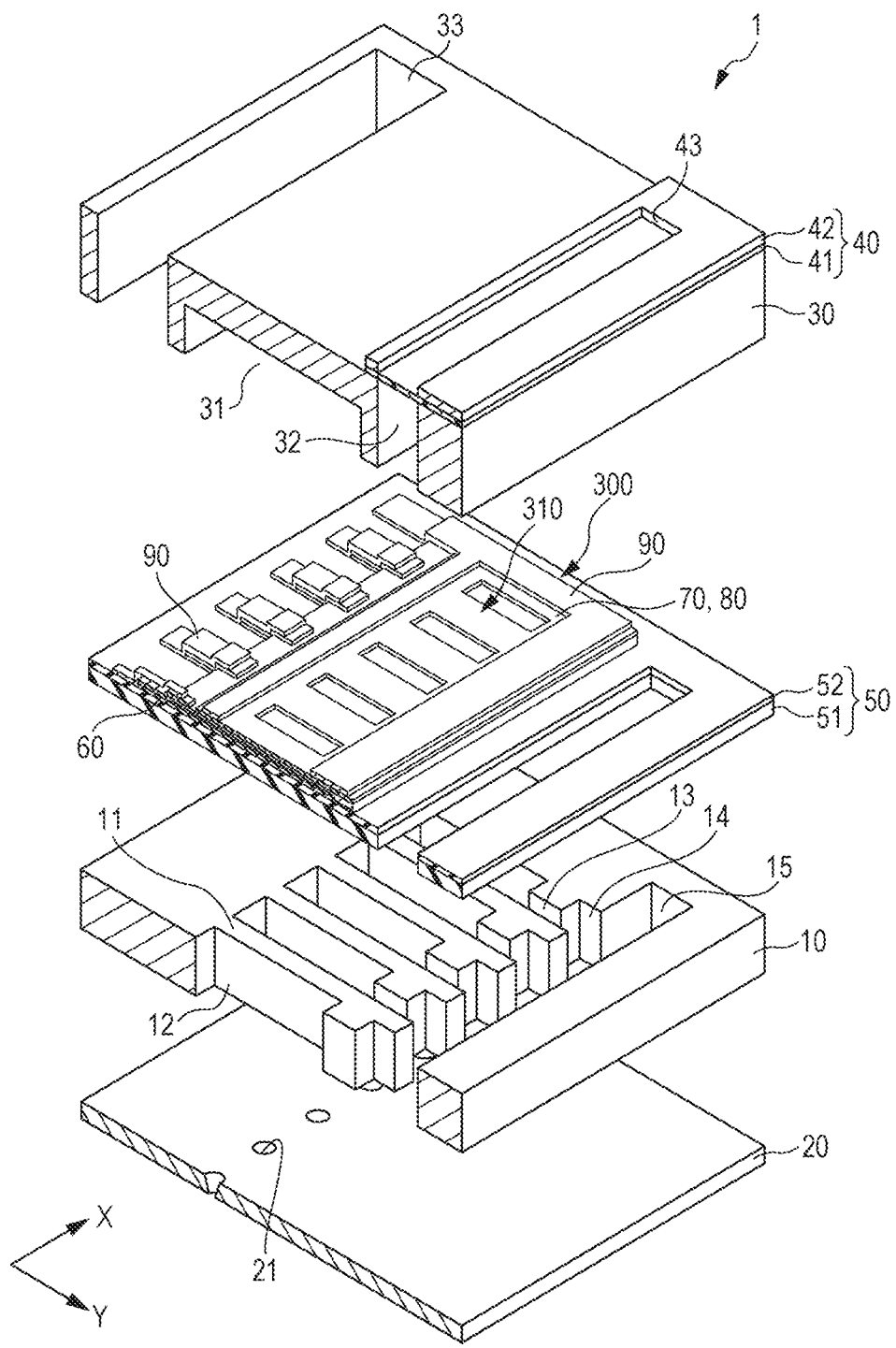
FIG. 2 is an exploded perspective view showing a recording head according to Embodiment 1.
Figure 3:
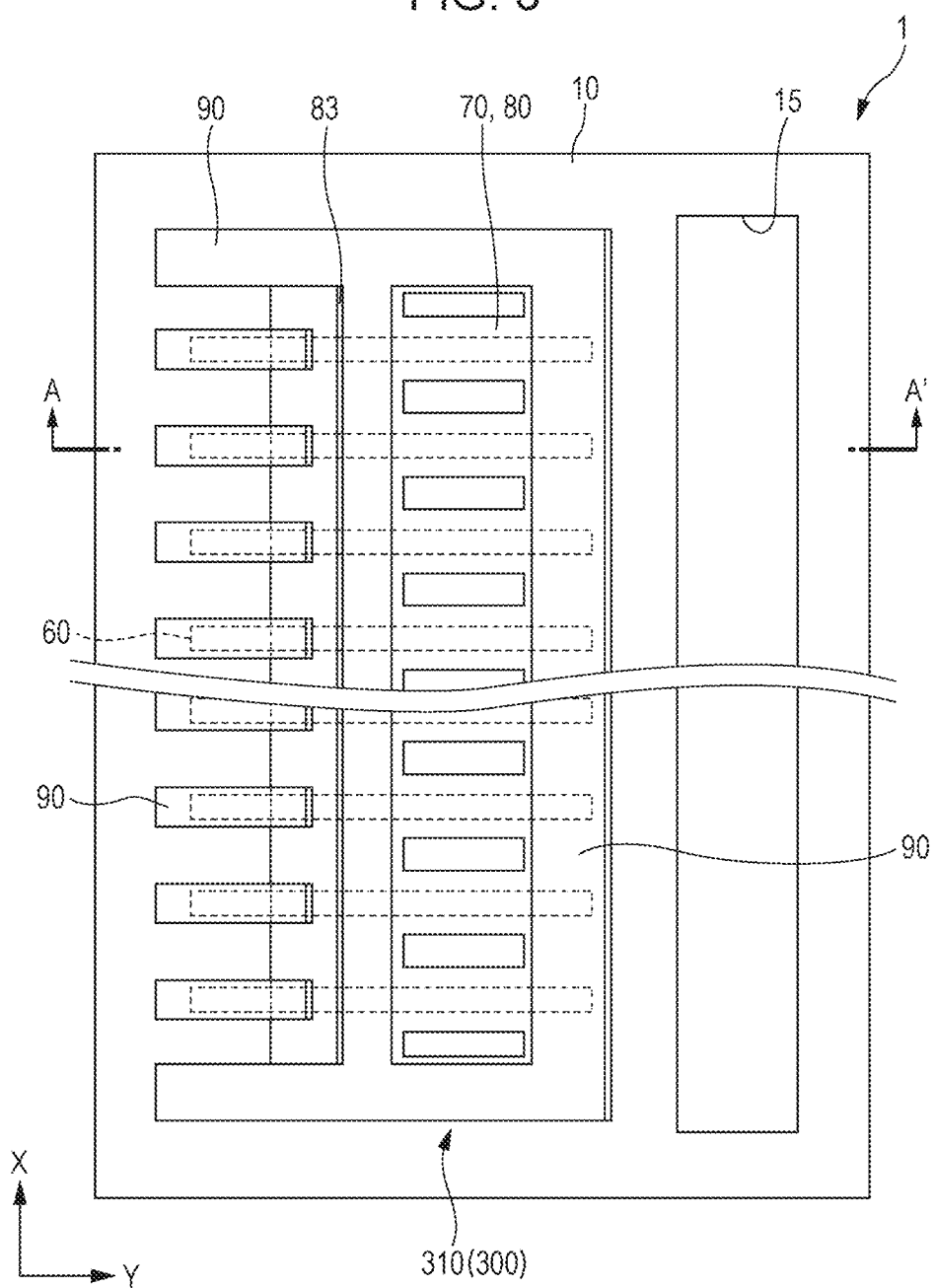
FIG. 3 is a plan view showing the recording head according to Embodiment 1.
Figure 4:
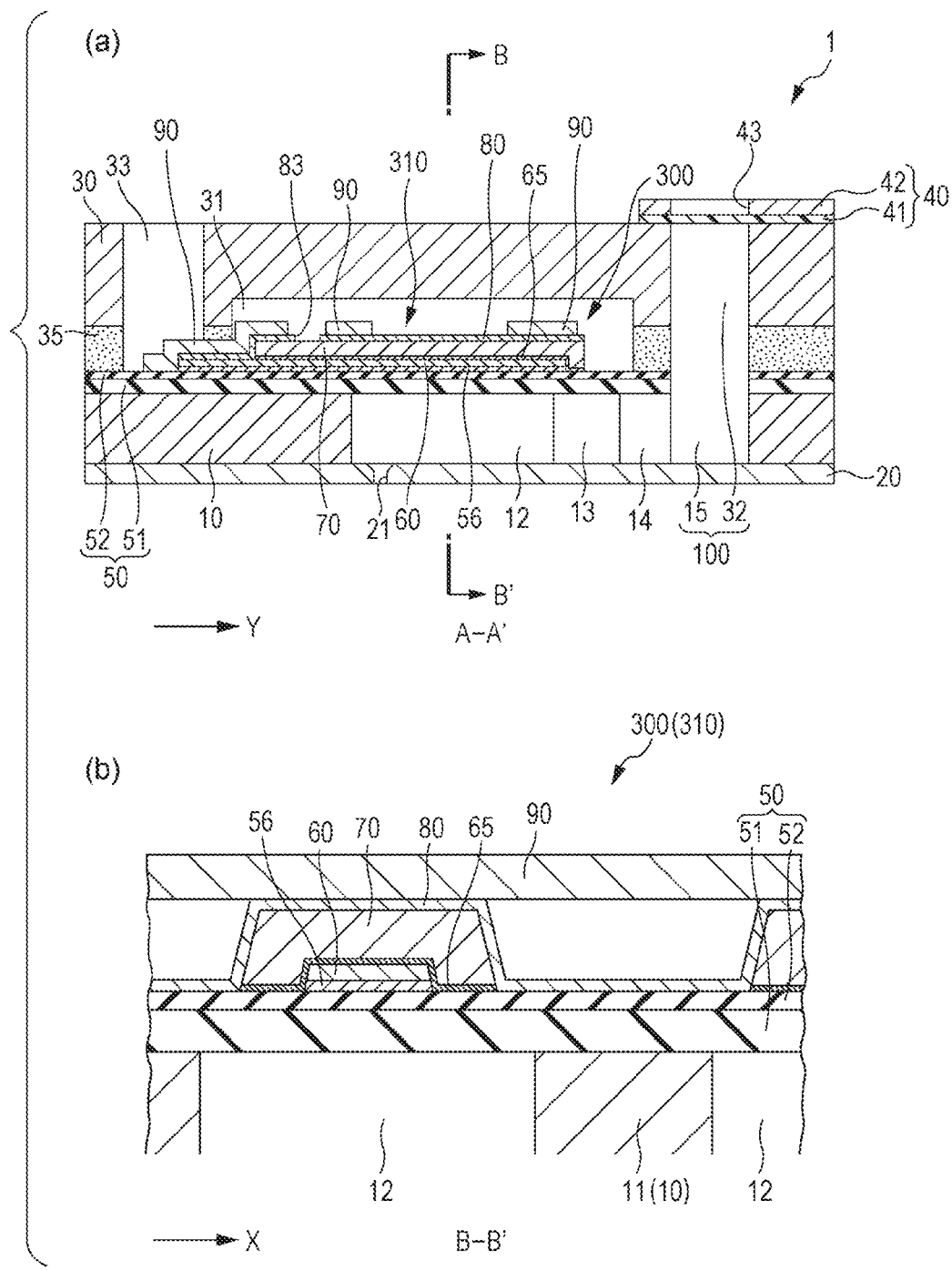
FIG. 4 shows cross-sectional views showing the recording head according to Embodiment 1.

An example of an ink jet recording head 1 mounted on the ink jet recording apparatus I will be described with reference to FIGS. 2 to 4. FIG. 2 is an exploded perspective view of the ink jet recording head which is an example of the liquid ejecting head according to this embodiment, and FIG. 3 is a plan view of a channel forming substrate on the piezoelectric element side. FIG. 4(a) is a cross-sectional view taken along line A-A' of FIG. 3, and FIG. 4(b) is a cross-sectional view taken along line B-B' of FIG. 4(a).

As shown in the drawings, a channel forming substrate 10 has a pressure generation chamber 12 formed therein. The pressure generation chamber 12 partitioned by a plurality of partition walls 11 is arranged in a direction in which a plurality of nozzle openings 21 discharging the same color ink are arranged. Hereinbelow, the direction in which the pressure generation chambers 12 are arranged in the channel forming substrate 10 will be referred to as a width direction or a first direction X, and a direction perpendicular to the first direction X will be referred to as a second direction Y.

An ink supply path 13 having an opening area reduced by narrowing one side of the pressure generation chamber 12 in the first direction X and a communication path 14 having almost the same width as the pressure generation chamber 12 in the first direction X are partitioned by the plurality of partition walls 11 on one end portion side of the pressure generation chamber 12 of the channel forming substrate 10 in the second direction Y. A communication portion 15 constituting a part of a manifold 100 which is an ink chamber common to the respective pressure generation chambers 12 is formed outside of the communication path 14 (on the opposite side to the pressure generation chamber 12 in the second direction Y). That is, in the channel forming substrate 10, a liquid channel formed of the pressure generation chambers 12, the ink supply paths 13, the communication paths 14, and the communication portion 15 is formed.

A nozzle plate 20 having nozzle openings 21 communicating with the respective pressure generation chambers 12 is bonded to one surface side of the channel forming substrate 10, that is, a surface where the liquid channels such as the pressure generation chambers 12 open by an adhesive, a thermal bonding film or the like. The nozzle openings 21 are arranged in the first direction X in the nozzle plate 20.

A vibrating plate 50 formed of an elastic film 51 made of $SiO_2$ (silicon dioxide) and the like and an insulating film 52 made of $ZrO_2$ (zirconium oxide) and the like is provided on the other side opposed to the one surface side of the channel forming substrate 10. However, the configuration of the vibrating plate 50 is not limited to the above-described example, and a part of the channel forming substrate 10 may be used as the elastic film by being subjected to thinning.

A first electrode 60 having a thickness of approximately 0.2 μm is provided over the insulating film 52 via an adhesion layer 56 made of $TiO_2$ (titanium oxide) and the like and having a thickness of approximately 10 μm to 50 μm, and a seed layer 65 having a thickness of approximately less than 20 nm is provided so as to overlap the adhesion layer 56, the first electrode 60, and the vibrating plate 50. The seed layer 65 is provided with a piezoelectric layer 70 having a thickness of approximately 3.0 μm or less, and preferably approximately 0.5 μm to 1.5 μm, and a second electrode 80 having a thickness of approximately 0.05 μm. Here, a piezoelectric element 300 is a portion in which the first electrode 60, the seed layer 65, the piezoelectric layer 70, and the second electrode 80 are stacked. The piezoelectric element 300 is not limited to a configuration in which the respective layers are directly adjacent to each other, and also includes a configuration in which other members are interposed between the layers. The adhesion layer 56 and the seed layer 65 may be omitted.

In this embodiment, the piezoelectric element 300 and the vibrating plate 50 which is displaced by driving of the piezoelectric element 300 will be both referred to as an actuator device. A portion including the vibrating plate 50 and the first electrode 60 acts as a vibrating plate, but the vibrating plate is not limited thereto. Only the first electrode 60 may act as a vibrating plate without provision of one or both of the elastic film 51 and the insulating film 52. In addition, the piezoelectric element 300 itself may substantially double as the vibrating plate. When the first electrode 60 is directly provided on the channel forming substrate 10, the first electrode 60 is preferably protected with an insulating protective film or the like so as to prevent conduction of the first electrode 60 and an ink.

In such a piezoelectric element 300, one of the electrodes generally acts as a common electrode, and the other electrode acts as an individual electrode by patterning for each pressure generation chamber 12. In this embodiment, the second electrode 80 is formed continuously over the plurality of pressure generation chambers 12 and acts as a common electrode, and the first electrode 60 acts as an individual electrode. However, there is no problem even when the electrodes are reversed due to the circumstances of the driving circuit or the like.

Hereinafter, the piezoelectric element 300 of this embodiment will be described in more detail. The first electrode 60 constituting an individual electrode is formed with a width smaller than the width of the pressure generation chamber 12 in the first direction X of the pressure generation chamber. In the second direction Y, both end portions of the first electrode 60 are provided to extend up to the outside of the pressure generation chamber 12.

The material of the first electrode 60 is not particularly limited as long as it has a conductive property. Noble metal such as platinum (Pt) or iridium (Ir) is representatively used from the viewpoint of easy control of orientation of the piezoelectric layer 70. The first electrode 60 of this embodiment is preferentially oriented to a (111) plane, but the state of the orientation is not limited to the above-described example. In this specification, the preferential orientation means that all or most crystals (for example, 80% or more) are oriented in a certain direction, for example, to a (111) plane or a (100) plane.

The seed layer 65 is formed over an upper surface and a side surface of the first electrode 60, a side surface of the adhesion layer 56, and the vibrating plate 50. Such a seed layer 65 is configured to be formed of a complex oxide having a perovskite structure. In the A-site of the perovskite structure, that is, $ABO_3$ structure, oxygen is 12-coordinated, and in the B-site thereof, oxygen is 6-coordinated to form an octahedron.

The seed layer 65 has the same perovskite structure as the piezoelectric material of the piezoelectric layer 70, and thus has piezoelectric characteristics. Particularly, the seed layer 65 of this embodiment is configured to be formed of a complex oxide containing Bi in the A-site and Mn in the B-site, and the seed layer 65 of the seed layer 65 and the piezoelectric layer 70 may act together as the piezoelectric layer in the relationship with the constituent material of the piezoelectric layer 70 containing Bi in the same manner. The boundary between the seed layer 65 and the piezoelectric layer 70 is not always required to be distinct.

In the case of the seed layer 65, a complex oxide in which a part of elements in the A-site and the B-site is substituted with other elements may be used. For example, elements such as Ba and La (lanthanum) may further exist other than Bi in the A-site, and elements such as Ti, Zr (zirconium), and Nb (niobium) may further exist together with Mn in the B-site. The seed layer 65 also includes a complex oxide having a composition deviated from the stoichiometric composition ($ABO_3$) due to the deficiency or excess of the element.

The seed layer 65 of this embodiment is configured to be preferentially oriented to the (100) plane. Such a seed layer 65 may function as an orientation control layer which preferentially orients the piezoelectric layer 70 formed thereon to the (100) plane. The seed layer 65 has a thickness of less than 20 nm. When the seed layer 65 is made very thin as above, voltage distribution to the seed layer 65 is reduced, and thus a voltage is efficiently applied to the piezoelectric layer 70.

Here, the piezoelectric layer 70 of this embodiment is made of a piezoelectric material expressed as a mixed crystal including a first component formed of a complex oxide having a perovskite structure and a rhombohedral structure and containing Bi in the A-site and Fe in the B-site, a second component formed of a complex oxide having a perovskite structure and a tetragonal structure and containing Ba in the A-site and Ti in the B-site, and a third component formed of a complex oxide having a perovskite structure and a tetragonal structure and containing Bi and K in the A-site and Ti in the B-site.

That is, the piezoelectric layer 70 of this embodiment is made of a piezoelectric material in which in the complex oxide of the first component having a rhombohedral structure and the complex oxide of the second component having a tetragonal structure, a part of the complex oxide of the second component is substituted with the third component having the same tetragonal structure. Since the substitution is performed between the complex oxides having a tetragonal structure, an improvement in displacement and a reduction in leak current can be balanced when the composition ratio of the piezoelectric material is adjusted without greatly changing the overall crystalline structure and the composition is appropriate. That is, a lattice distortion is generated by introducing the third component, and displacement characteristics can be improved by adjusting the composition ratio in a morphotropic phase boundary (MPB) region of the piezoelectric material. In addition, when the content of a predetermined kind of metal (for example, Fe) in the first component is relatively reduced by introducing the third component, the generation of cations (for example, $Fe^{2+}$) which may be a cause of a leak current can be suppressed, and thus the leak current can be reduced. Moreover, the load on the environment can also be reduced by suppressing the content of lead.

In the complex oxide having a perovskite structure, that is, $ABO_3$ structure, oxygen is 12-coordinated in the A-site thereof, and in the B-site thereof, oxygen is 6-coordinated to form an octahedron as in the seed layer 65. The compositions of the first component, the second component, and the third component are not limited to the above-described examples, and a part of the A-site and the B-site may be substituted with various elements. For example, in the complex oxide having a rhombohedral crystalline structure in the first component, a part of the B-site may be substituted with manganese (Mn). According to this, the generation of cations (for example, $Fe^{2+}$) which may be a cause of a leak current can be further suppressed by Mn.

Accordingly, a complex oxide in which the first component has a composition expressed by the following Formula (1) with Mn contained in the B-site, the second component has a composition expressed by the following Formula (2), and the third component has a composition expressed by the following Formula (3) can be used. The leak current can be further reduced by stabilizing charges of a predetermined kind of metal (for example, $Fe^{3+}$) with Ti in $(Bi,K)TiO_3$ which is the third component.

$$Bi(Fe,Mn)O_3 \quad (1)$$

$$BaTiO_3 \quad (2)$$

$$(Bi,K)TiO_3 \quad (3)$$

The complex oxide having a perovskite structure also includes a complex oxide having a composition deviated from the stoichiometric composition due to the deficiency or excess and a complex oxide in which a part of elements is substituted with other elements. That is, as long as the perovskite structure is acquired, an inevitable deviation in composition due to lattice mismatch, oxygen deficiency, or the like and substitution of a part of elements are permitted. When a stoichiometric ratio is 1, a material in which the stoichiometric ratio is 0.85 to 1.20 is permitted.

Therefore, in the first component, a part of Bi in the A-site may be substituted with Ba, La, Sm (samarium), Ce (cerium) and the like, and a part of Fe and Mn in the B-site may be substituted with Al (aluminum), Co (Cobalt), and the like. In addition, in the second component, a part of Ba in the A-site may also be substituted with Bi, La, Sm, Ce, and the like, and a part of Ti in the B-site may also be substituted with Al, Co, and the like. In the second component, a part of Bi and K in the A-site may also be substituted with Ba, La, Sm, Ce, and the like, and a part of Ti in the B-site may also be substituted with Al, Co, and the like. In the case of a complex oxide containing these other elements, it is preferably configured to have a perovskite structure.

In addition, the molar ratio (rhombohedral crystal/tetragonal crystal) of the complex oxide having a rhombohedral structure in the first component to the total complex oxides having a tetragonal structure in the second and third components is preferably 75/25 to 55/45, and more preferably 70/30 to 65/35. According to this, the composition ratio is easily adjusted in the MPB region of the piezoelectric material, and thus displacement characteristics are easily improved. In the examples of the above-described Formulas (1) to (3), the complex oxide as the first component having a rhombohedral structure is bismuth manganate ferrate ($Bi(Fe_{0.95}Mn_{0.05})O_3$), the complex oxide as the second component having a tetragonal structure is barium titanate ($BaTiO_3$), and the complex oxide as the third component having a tetragonal structure is bismuth potassium titanate ($(Bi_{0.5}K_{0.5})TiO_3$).

The content of the complex oxide having a perovskite structure and a tetragonal structure and containing Ba in the A-site and Ti in the B-site, that is, $BaTiO_3$ of the above-described Formula (2) can be adjusted to 25 mol % to 35 mol %. According to this, the abundance of the complex oxide of the first component having a rhombohedral crystalline structure is secured. The content of $(Bi,K)TiO_3$ of the third component is preferably 5 mol % to 20 mol %, and more preferably 5 mol % to 10 mol %. According to this, the composition ratio is easily adjusted in the MPB region of the piezoelectric material, and thus displacement characteristics can be easily improved.

The piezoelectric layer 70 of this embodiment is preferentially oriented to the (100) plane. The leak current can be further reduced and displacement characteristics can also be enhanced. Such a piezoelectric layer 70 is provided continuously in the first direction X so as to have a predetermined width in the second direction Y. The width of the piezoelectric layer 70 in the second direction Y is larger than a length of the pressure generation chamber 12 in the second direction Y, and the piezoelectric layer 70 is provided up to the outside of the pressure generation chamber 12 in the second direction Y of the pressure generation chamber 12.

An end portion of the piezoelectric layer 70 on the side of the ink supply path 13 in the second direction Y of the pressure generation chamber 12 is positioned outside an end portion of the first electrode 60. That is, the end portion of the first electrode 60 is covered with the piezoelectric layer 70. An end portion of the piezoelectric layer 70 on the side of the nozzle openings 21 is positioned more inside than the end portion of the first electrode 60 (on the side of the pressure generation chamber 12), and the end portion of the first electrode 60 on the side of the nozzle openings 21 is not covered with the piezoelectric layer 70.

The second electrode 80 is provided on the side opposite to the first electrode 60 of the piezoelectric layer 70 and is configured as a common electrode. In this embodiment, the second electrode 80 is provided continuously over an upper surface and a side surface of the piezoelectric layer 70 and the vibrating plate 50. The material of the second electrode 80 can be appropriately selected and used among materials which can be used as the first electrode 60.

A lead electrode 90 is connected to the first electrode 60 and the second electrode 80 of the piezoelectric element 300. Such a lead electrode 90 can be formed over the whole one surface of the channel forming substrate 10 and be then patterned into a predetermined shape.

A protective substrate 30 which protects the piezoelectric element 300 is bonded to the channel forming substrate 10 having the piezoelectric element 300 formed thereon by an adhesive 35. The protective substrate 30 is provided with a piezoelectric element protective portion 31 which is a concave portion which defines the space in which the piezoelectric element 300 is accommodated. In addition, the protective substrate 30 is provided with a manifold portion 32 constituting a part of the manifold 100. The manifold portion 32 is formed in the width direction of the pressure generation chamber 12 through the protective substrate 30 in the thickness direction (in a direction perpendicular to the first direction X and the second direction Y), and communicates with the communication portion 15 of the channel forming substrate 10 as described above.

The protective substrate 30 is provided with a through hole 33 passing through the protective substrate 30 in the thickness direction. The lead electrode 90 connected to the first electrode 60 of each active portion is provided to be exposed to the inside of the through hole 33.

A compliance substrate 40 formed of a sealing film 41 and a stationary plate 42 is bonded to the protective substrate 30, and one surface of the manifold portion 32 is sealed with the sealing film 41. A region in the stationary plate 42 opposed to the manifold 100 is an opening portion 43 completely removed in the thickness direction, and one surface of the manifold 100 is sealed only with the sealing film 41.

In such an ink jet recording head 1 of this embodiment, an ink is introduced from an ink inlet connected to external ink supply means (not shown) to fill the inside from the manifold 100 to the nozzle openings 21 with the ink. Then, a voltage is applied between the first electrode 60 and the second electrode 80 corresponding to the pressure generation chamber 12 in accordance with a recording signal from a driving circuit, and the vibrating plate 50, the adhesion layer 56, the first electrode 60, the seed layer 65, and the piezoelectric layer 70 are deflection-deformed to increase the pressure in each pressure generation chamber 12 to thus eject ink droplets from the nozzle openings 21.

Figure 7:
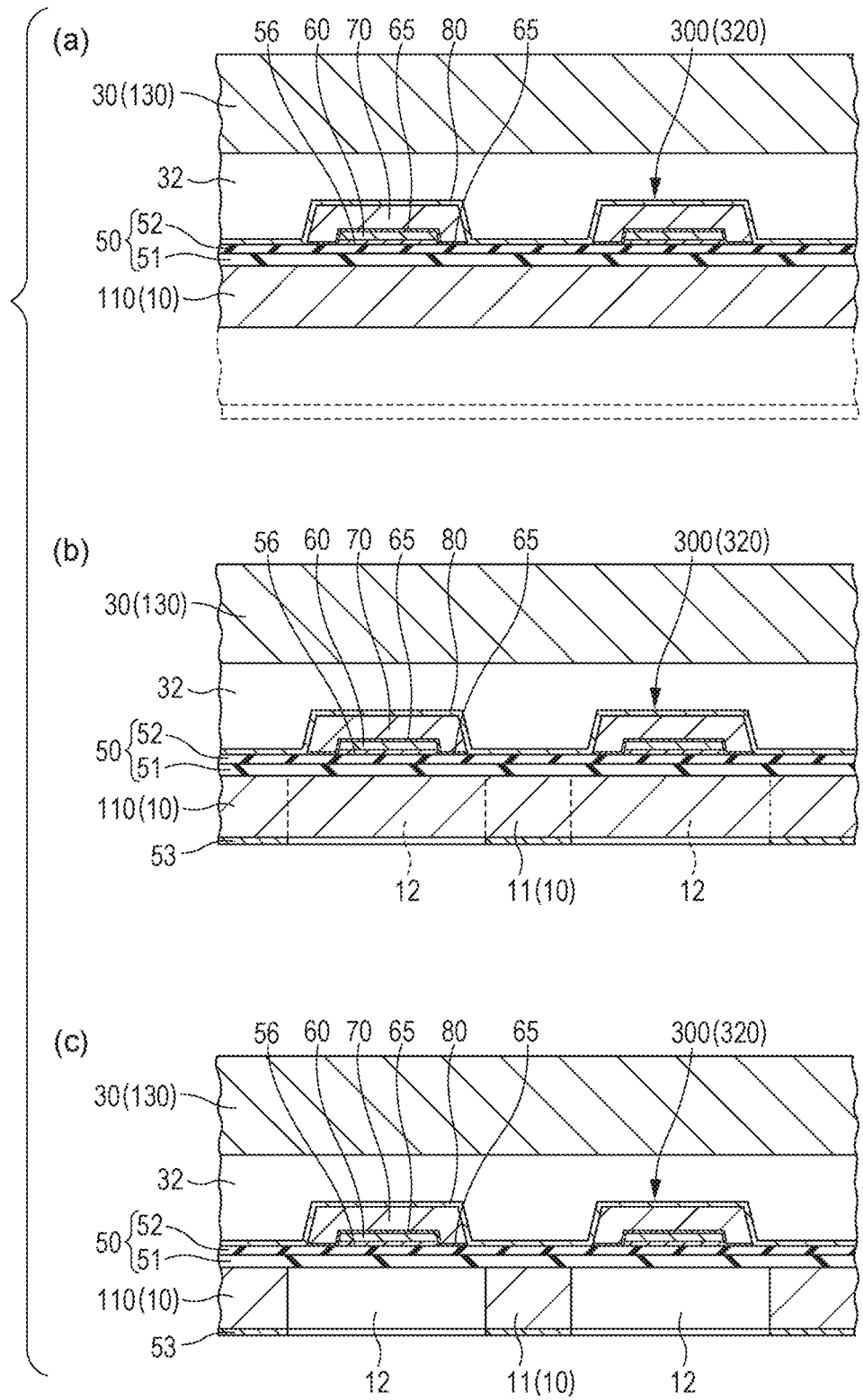
FIG. 7 shows cross-sectional views showing an example of the manufacturing of the recording head according to Embodiment 1.

Next, an example of a method of manufacturing an ink jet recording head of this embodiment will be described with reference to FIGS. 5 to 7.

Figure 5:
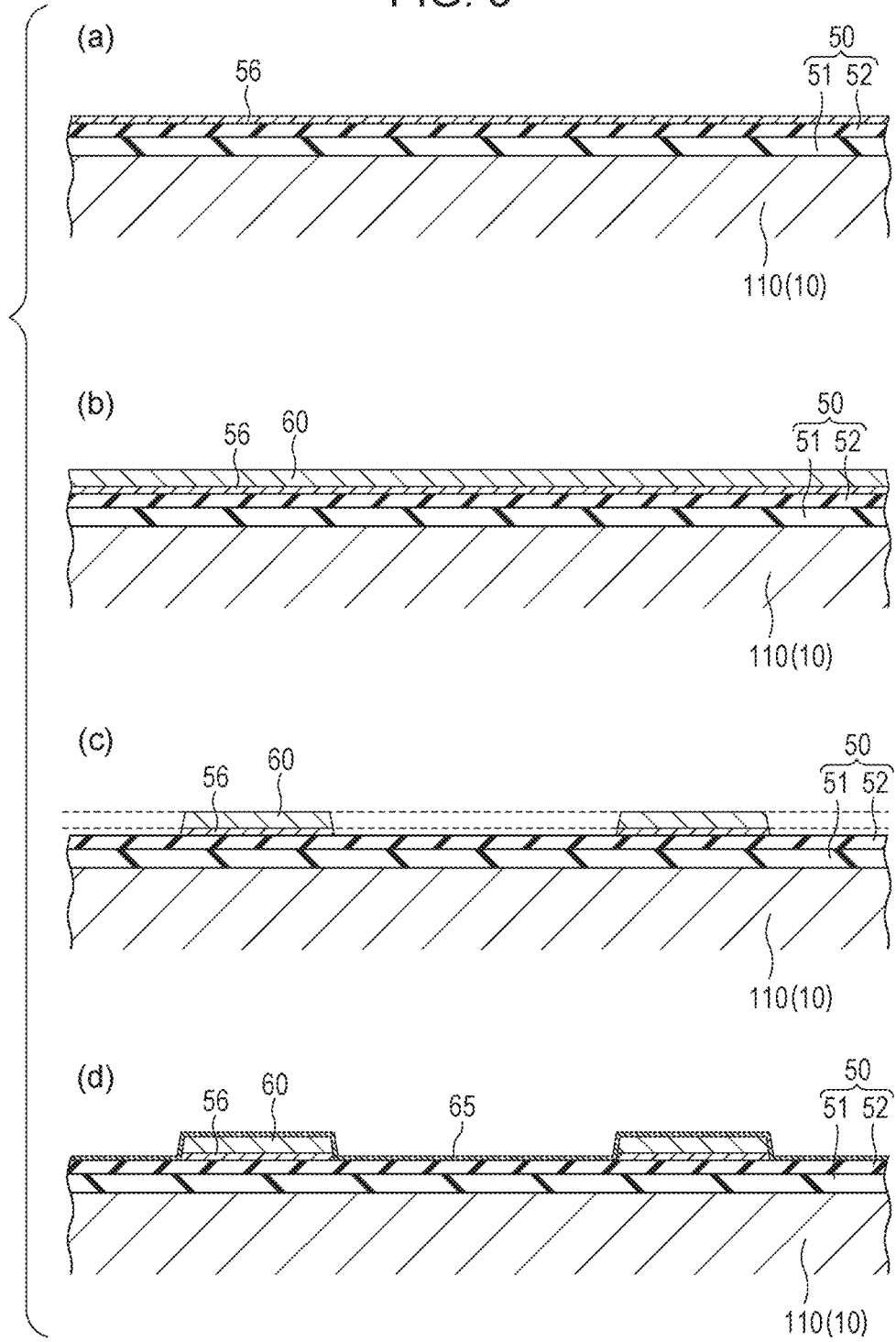
FIG. 5 shows cross-sectional views showing an example of the manufacturing of the recording head according to Embodiment 1.

First, as shown in FIG. 5(*a*), an elastic film 51 made of silicon dioxide and the like is formed on a surface of a wafer for a channel forming substrate, and an insulating film 52 made of zirconium oxide and the like is formed on the elastic film 51 to configure a vibrating plate 50. Next, an adhesion layer 56 made of titanium oxide and the like is formed on the insulating film 52 through a sputtering method, thermal oxidation, or the like.

Next, as shown in FIG. 5(*b*), a first electrode 60 made of platinum is formed on the adhesion layer 56 through a sputtering method, a vapor deposition method, or the like.

Next, as shown in FIG. 5(*c*), the adhesion layer 56 and the first electrode 60 are simultaneously subjected to patterning using a resist (not shown) having a predetermined shape as a mask on the first electrode 60.

Next, as shown in FIG. 5(*d*), the resist is detached, and then a seed layer 65 is formed over the first electrode 60, the adhesion layer 56, and the vibrating plate 50. The seed layer 65 can be formed using, for example, a metal-organic decomposition (MOD) method in which a precursor solution containing metal complexes is applied to form a seed layer precursor film and the film is dried and further baked at a high temperature to obtain a seed layer 65 formed of a metal oxide, or a chemical solution method such as a sol-gel method, that is, a liquid phase method. The seed layer 65 can also be formed using a laser ablation method, a sputtering method, a pulse laser deposition (PLD) method, a CVD method, an aerosol deposition method, or the like. In this embodiment, the seed layer 65 is formed to be composed of one layer, but may be formed to be composed of a plurality of layers.

Next, as shown in FIG. 6(*a*), a piezoelectric layer 70 is formed by forming a plurality of piezoelectric films 74 on the seed layer 65. The piezoelectric film 74 can be formed in the same manner as in the case of the seed layer 65 using, for example, a MOD method in which a solution containing metal complexes is applied, dried, and degreased to obtain a piezoelectric film 74, or a chemical solution method such as a sol-gel method. The piezoelectric film 74 can also be formed using a laser ablation method, a sputtering method, a pulse laser deposition (PLD) method, a CVD method, an aerosol deposition method, or the like.

As a specific example of a procedure for forming the piezoelectric film 74 using a chemical solution method, first, a composition for forming an oxide layer (precursor solution) formed of a MOD solution or a sol containing metal complexes containing Bi, Fe, Ba, K, and Ti is applied to form a piezoelectric precursor film (not shown) on the seed layer 65 (application process).

The precursor solution to be applied is a solution obtained by mixing metal complexes for forming a piezoelectric precursor film containing Bi, Fe, Ba, K, and Ti by baking, and dissolving or dispersing the resulting mixture in an organic solvent. In addition, when forming a piezoelectric precursor film containing Mn, a precursor solution containing a metal complex having Mn is used. Regarding the mixing ratio of the metal complexes having metal complexes containing Bi, Fe, Mn, Ba, K, and Ti, respectively, the mixing may be performed so as to mix the respective metals at a desired molar ratio. Examples of the metal complex containing Bi include bismuth 2-ethylhexanoate and bismuth acetate. Examples of the metal complex containing Fe include iron 2-ethylhexanoate, ferric acetate, and tris(acetylacetonato)iron. Examples of the metal complex containing Mn include manganese 2-ethylhexanoate and manganese acetate. Examples of the metal complex containing Ba include barium acetate, barium isopropoxide, barium 2-ethylhexanoate, and barium acetylacetonate. Examples of the metal complex containing K include potassium ethoxide, potassium 2-ethylhexanoate, potassium acetate, potassium acetylacetonate, and potassium tert-butoxide. Examples of the metal complex containing Ti include titanium 2-ethylhexanoate and titanium acetate. Examples of the solvent of the precursor solution include propanol, butanol, pentanol, hexanol, octanol, ethylene glycol, propylene glycol, octane, decane, cyclohexane, xylene, toluene, tetrahydrofuran, acetic acid, and octylic acid.

Next, this piezoelectric precursor film is dried for a certain length of time through heating to a predetermined temperature of, for example, 130° C. to 180° C. (drying process). Next, the dried piezoelectric precursor film is held for a certain length of time through heating to a predetermined temperature of, for example, 300° C. to 400° C. (degreasing process). Next, the piezoelectric precursor film is crystallized by being held for a certain length of time through heating to a predetermined temperature of, for example, 650° C. to 800° C. to form a piezoelectric film 74 (baking process). Examples of the heater which is used in the drying process, the degreasing process, and the baking process include a rapid thermal annealing (RTA) device which performs heating by irradiation from an infrared lamp, and a hot plate. The above-described application process, drying process, and degreasing process, or application process, drying process, degreasing process, and baking process are repeated a plurality of times in accordance with a desired thickness and the like to form a piezoelectric layer 70 formed of, for example, 12 piezoelectric films 74.

As shown in FIG. 6(b), the piezoelectric layer 70 and the seed layer 65 are subjected to patterning corresponding to each pressure generation chamber 12, and a second electrode 80 is formed on one surface side of the wafer 110 for a channel forming substrate (the surface side where the piezoelectric layer 70 is formed), that is, over an upper surface and a side surface of the piezoelectric layer 70 and the vibrating plate 50. So-called photolithography can be used for patterning. However, the patterning may also be performed through dry etching such as reactive ion etching or ion milling, wet etching, or the like.

Next, a lead electrode 90 is formed and patterning into a predetermined shape is performed. As shown in FIG. 7(a), a wafer 130 for a protective substrate is bonded to the side of piezoelectric elements 300 of the wafer 110 for a channel forming substrate via an adhesive (reference number: 35 in FIG. 2), and then the wafer 110 for a channel forming substrate is thinned into a predetermined thickness. Thereafter, as shown in FIG. 7(b), a new mask film 53 is formed on the wafer 110 for a channel forming substrate and patterning into a predetermined shape is performed. As shown in FIG. 7(c), the wafer 110 for a channel forming substrate is subjected to anisotropic etching (wet etching) using an alkaline solution such as KOH via the mask film 53.

Thereafter, the pressure generation chambers 12 corresponding to the piezoelectric elements 300, the ink supply paths 13, the communication paths 14, the communication portion 15 and the like shown in FIG. 2 are formed in the usual manner, and unnecessary portions in outer circumferential portions of the wafer 110 for a channel forming substrate and the wafer 130 for a protective substrate are removed by cutting by dicing or the like. A nozzle plate 20 having nozzle openings 21 is bonded to a surface of the wafer 110 for a channel forming substrate opposite to the wafer 130 for a protective substrate, a compliance substrate 40 is bonded to the wafer 130 for a protective substrate, and the wafer 110 for a channel forming substrate and the like are divided into a channel forming substrate 10 having a size of one chip and the like to make an ink jet recording head 1 of this embodiment.

EXAMPLES

Hereinafter, the invention will be described in more detail with examples. The invention is not limited to the following examples.

Example 1

Production of First Electrode or the Like

An elastic film 51 as a silicon dioxide film having a thickness of 1200 nm was formed on a surface of a (100) single crystal silicon substrate by thermal oxidation. Next, a titanium film having a thickness of 40 nm was produced on the elastic film 51 through a RF magnetron sputtering method, and subjected to thermal oxidation to form a titanium oxide film as an adhesion layer 56. Next, on the adhesion layer 56, a first electrode 60 formed of a platinum film oriented to a (111) plane and having a thickness of 100 nm was formed through a RF magnetron sputtering method.

<Production of Seed Layer>

Next, a seed layer 65 was produced on the first electrode 60. The process is as follows. First, n-octane solutions of bismuth 2-ethylhexanoate and manganese 2-ethylhexanoate were mixed so that a molar concentration ratio of Bi to Mn was 100:100, and thus a precursor solution for a seed layer was prepared. Then, the precursor solution for a seed layer was added dropwise to the above-described substrate on which the adhesion layer 56 and the first electrode 60 were formed, the substrate was rotated at 3000 rpm to form a seed layer precursor film through a spin coating method (process of applying precursor solution for seed layer), and the film was dried for 2 minutes at 180° C. on a hot plate (seed layer drying process). Next, degreasing was performed for 2 minutes at 350° C. (seed layer degreasing process), and the temperature was increased to 700° C. at 3° C./sec to perform baking for 2 minutes at 700° C. using a rapid thermal annealing (RTA) device in the oxide atmosphere (seed layer baking process). Through the above processes, the seed layer 65 made of bismuth manganite ($BiMnO_3$) was formed.

<Production of Piezoelectric Layer>

Next, a piezoelectric layer 70 was produced on the seed layer 65. The process is as follows. First, n-octane solutions of bismuth 2-ethylhexanoate, barium 2-ethylhexanoate, iron 2-ethylhexanoate, manganese 2-ethylhexanoate, magnesium 2-ethylhexanoate, and titanium 2-ethylhexanoate were mixed so that a molar ratio of Bi, Fe, Mn, Ba, K, and Ti was 72.5:66.5:3.5:25:2.5:30 (Bi:Fe:Mn:Ba:K:Ti), and thus a precursor solution for a piezoelectric layer was prepared. Next, the precursor solution for a piezoelectric layer was added dropwise to the seed layer 65. The substrate was rotated for 6 seconds at 500 rpm, and then rotated for 20 seconds at 3000 rpm to form a film through a spin coating method (application process). Next, the substrate was placed on a hot plate and dried for 2 minutes at 180° C. (drying process), and degreasing was performed for 2 minutes at 350° C. (degreasing process). The process ranging from the application to the degreasing was repeated 2 times, and then baking was performed for 5 minutes at 750° C. using a RTA device in the oxide atmosphere (baking process). Next, the above-described processes were repeated six times to form the piezoelectric layer 70 through total 12 times of application.

<Production of Second Electrode>

A platinum film having a thickness of 100 nm was formed through a RF magnetron sputtering method on the produced piezoelectric layer 70 to serve as a second electrode 80. A piezoelectric element 300 of Example 1 was obtained through the above processes.

Examples 2 to 12

A piezoelectric element of Example 2 was obtained through the same processes as in Example 1, except that a piezoelectric material having a different composition of Bi, Fe, Mn, Ba, K, and Ti from that of Example 1 was used. That is, mixing was performed to meet a ratio of 70:61.75:3.25:25:5.0:35 (Bi:Fe:Mn:Ba:K:Ti), and thus a precursor solution for a piezoelectric layer was prepared. Using this precursor solution for a piezoelectric layer, the same operation as Example 1 was performed, and thus a piezoelectric layer was formed through total 12 times of application.

In addition, piezoelectric elements of Examples 3 to 12 were obtained through the same processes as in Example 1, except that piezoelectric materials having different compositions of Bi, Fe, Mn, Ba, K, and Ti from that of Example 1 as shown in Table 1 were used.

Comparative Example 1

A piezoelectric element of Comparative Example 1 was obtained through the same processes as in Example 1, except that a piezoelectric material containing no K, that is, with no content of K, was used. That is, mixing was performed to meet a ratio of 75:71.25:3.75:25:0:25 (Bi:Fe:Mn:Ba:K:Ti), and thus a precursor solution for a piezoelectric layer was prepared. Using this precursor solution for a piezoelectric layer, the same operation as Example 1 was performed, and thus a piezoelectric layer was formed through total 12 times of application.

The composition ratios of the piezoelectric materials and the test results of the examples and the comparative example are shown in Table 1. In Table 1, bismuth manganate ferrate $(Bi(Fe_{0.95}Mn_{0.05})O_3)$ as a first component is abbreviated as BFM, barium titanate $(BaTiO_3)$ as a second component is abbreviated as BT, and bismuth potassium titanate $((Bi_{0.5}K_{0.5})TiO_3)$ as a third component is abbreviated as BKT.

changes of the piezoelectric layer caused by the addition of $(Bi,K)TiO_3$ as a second component to the piezoelectric material are not confirmed.

<XRD Measurement>

Figure 9:
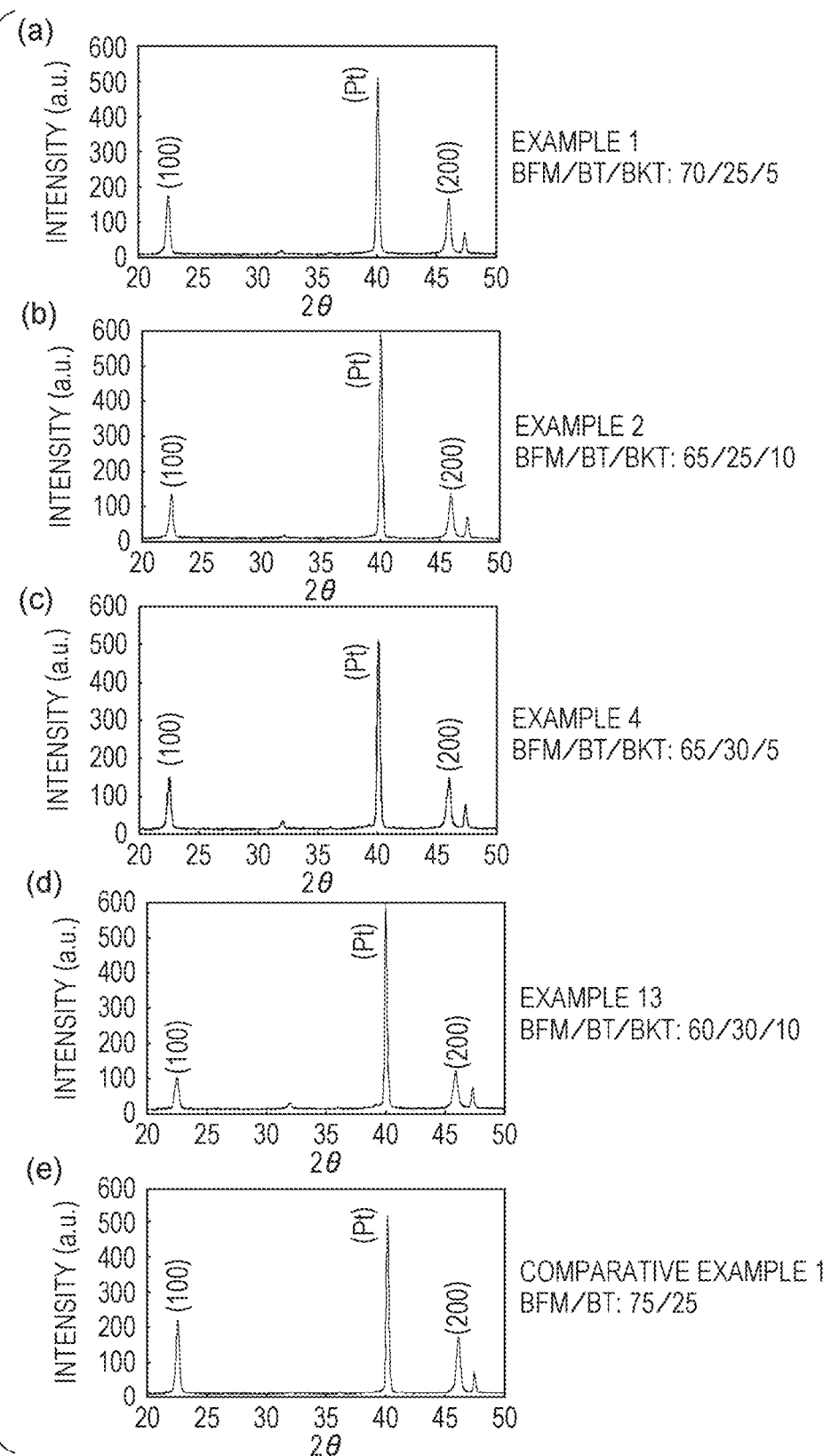
FIG. 9 shows diffraction charts showing X-ray diffraction intensity in the examples and the comparative example.

In Examples 1, 2, 4, and 13 and Comparative Example 1, the measurement of a diffraction chart obtained by X-ray diffraction (XRD) using CuKα as a radiation source and a two-dimensional detector (GADDS) as a detector with "D8 Discover" manufactured by Bruker AXS Inc. was performed to observe a crystalline structure and orientation. The position in which a diffraction peak is obtained is determined such that the (100) plane is 2θ=22.4° and the (111) plane is around 2θ=38.2°. The diffraction charts in Examples 1, 2, 4, and 13 are shown in FIGS. 9(a) to 9(d), respectively, and the diffraction chart in Comparative Example 1 is shown in FIG. 9(e). In any of Examples 1, 2, 4, and 13 and Comparative Example 1, a diffraction peak of a perovskite structure single phase was obtained. In addition, in any of Examples 1, 2, 4, and 13 and Comparative Example 1, a sharp peak indicating the (100) plane and a peak indicating the (200) plane derived from the perovskite structure were confirmed, and thus the piezoelectric layer was found to be preferentially oriented to the (100) plane.

<P-V Characteristics>

Figure 10:
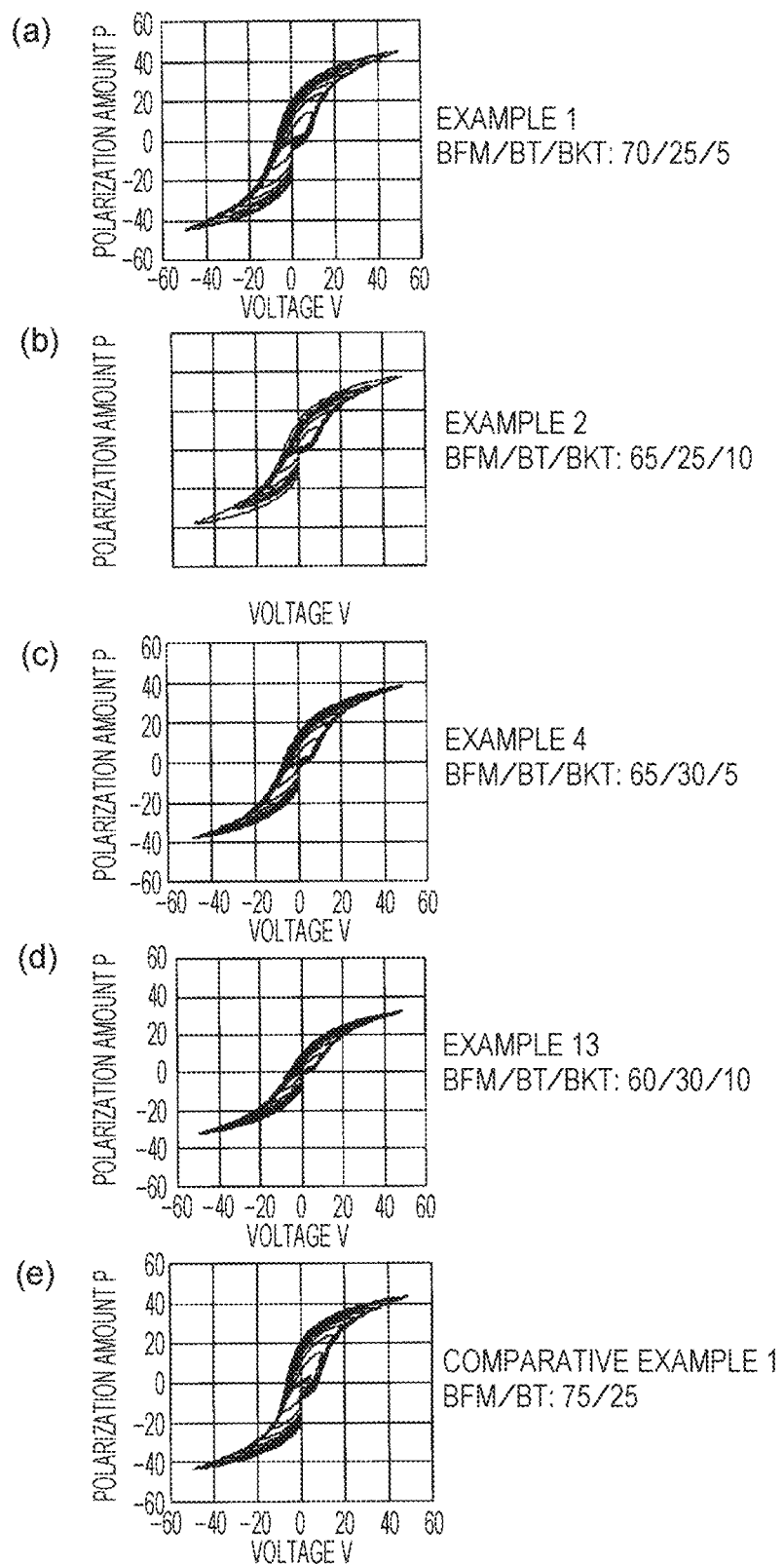
FIG. 10 shows diagrams showing polarization quantity (P)-voltage (V) characteristics in the examples and the comparative example.

In Examples 1, 2, 4, and 13 and Comparative Example 1, the relationship between a polarization quantity (P) and a voltage (V) was obtained by applying a triangular wave at a frequency of 1 kHz by "FCE-1A" manufactured by Toyo Corporation using an electrode pattern of ϕ=500 μm at room temperature (25° C.). Hysteresis loops in Examples 1, 2, 4, and 13 are shown in FIGS. 10(a) to 10(d), respectively, and a hysteresis loop in Comparative Example 1 is shown in FIG. 10(e). In any of Examples 1, 2, 4, and 13 and Comparative Example 1, the hysteresis loop derived from ferroelectricity was observed.

TABLE 1

| | Bi:Fe:Mn:Ba:K:Ti | Rhombohedral BFM | Tetragonal BT | BKT | Rhombohedral/ Tetragonal | Leak Current $(10^{-4}\ A/cm^2)$ | DBLI Displacement (relative value) |
|---|---|---|---|---|---|---|---|
| Example 1 | 72.5:66.5:3.5:25:2.5:30 | 70 | 25 | 5 | 70/30 | 6.13 | 1.30 |
| Example 2 | 70:61.75:3.25:25:5.0:35 | 65 | 25 | 10 | 65/35 | 3.71 | 1.11 |
| Example 3 | 73.5:68.4:3.6:25:1.5:28 | 72 | 25 | 3 | 72/28 | 6.55 | 0.98 |
| Example 4 | 67.5:61.75:3.25:30:2.5:35 | 65 | 30 | 5 | 65/35 | 2.47 | 1.14 |
| Example 5 | 71:63.65:3.35:25:4:33 | 67 | 25 | 8 | 67/33 | 3.71 | 1.11 |
| Example 6 | 67.5:57:3:25:7.5:40 | 60 | 25 | 15 | 60/40 | 1.34 | 1.15 |
| Example 7 | 65:52.25:2.75:25:10:45 | 55 | 25 | 20 | 55/45 | 0.557 | 1.09 |
| Example 8 | 77.5:71.25:3.75:20:2.5:25 | 75 | 20 | 5 | 75/25 | 8.34 | 0.99 |
| Example 9 | 74.5:68.4:3.6:23:2.5:28 | 72 | 23 | 5 | 72/28 | 6.06 | 1.06 |
| Example 10 | 69.5:63.65:3.35:28:2.5:33 | 67 | 28 | 5 | 67/33 | 3.38 | 1.04 |
| Example 11 | 67.5:61.75:3.25:30:2.5:35 | 65 | 30 | 5 | 65/35 | 3.62 | 0.98 |
| Example 12 | 62.5:57:3:35:2.5:40 | 60 | 35 | 5 | 60/40 | 1.78 | 0.94 |
| Example 13 | 65:57:3:30:5:40 | 60 | 30 | 10 | 60/40 | 1.61 | 0.98 |
| Comparative Example 1 | 75:71.25:3.75:25:0:25 | 75 | 25 | 0 | 75/25 | 1.03 × 10 | 1.00 |

Test Examples

SEM Image Observation

Figure 8:
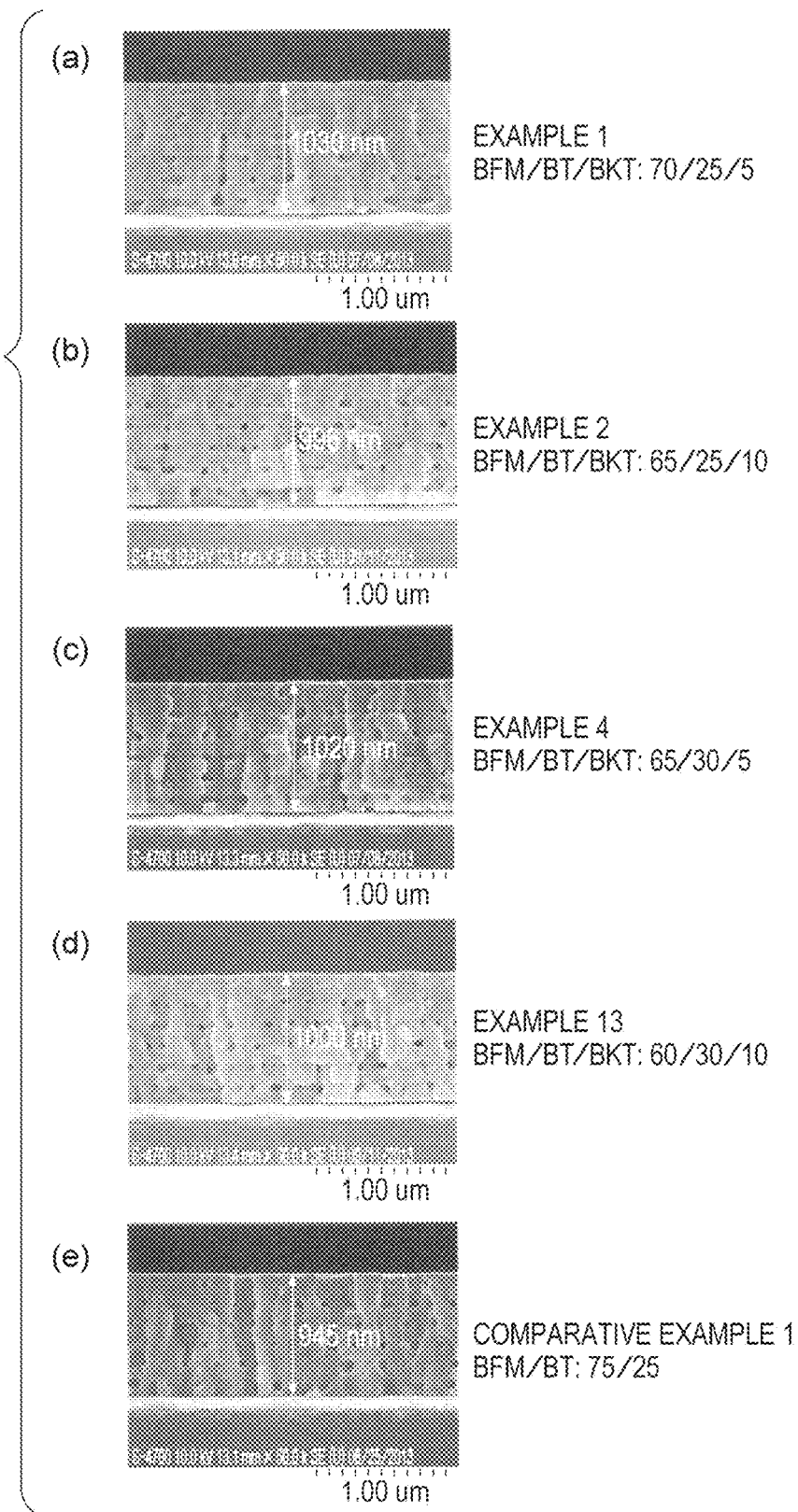
FIG. 8 shows SEM images showing cross-sections of piezoelectric layers in examples and a comparative example.

In Examples 1, 2, 4, and 13 and Comparative Example 1, a cross-section in a thickness direction of the piezoelectric layer before the formation of the second electrode was observed using a scanning electron microscope (SEM). The SEM images in Examples 1, 2, 4, and 13 are shown in FIGS. 8(a) to 8(d), and the SEM image in Comparative Example 1 is shown in FIG. 8(e). It was found that in any of Examples 1, 2, 4, and 13, almost the same morphology as Comparative Example 1 is obtained. That is, it was found that morphology <I-V Characteristics>

The relationship between a current (I) and a voltage (V) was obtained by applying a voltage of ±50 V in Examples 1, 2, 4, and 13 and Comparative Example 1. The measurement was performed using "4140B" manufactured by Hewlett-Packard Company under the atmosphere with a holding time of 2 seconds upon measurement. The measurement results are shown in FIG. 11. It was found that there is a tendency that in the piezoelectric elements of Examples 1, 2, 4, and 13, the current density (leak current) is smaller than in Comparative Example 1. That is, it was found that according to Examples 1, 2, 4, and 13, the leak current can be further reduced than in Comparative Example 1.

<DBLI Displacement>

Regarding Examples 1 and 4 and Comparative Example 1, the relationship between a distortion induced by an electric field and a voltage was obtained in a unipolar mode using a displacement measuring device (DBLI) manufactured by aixACCT Systems, Inc. The measurement was performed at room temperature (25° C.) using an electrode pattern of φ=500 μm and a triangular wave at a frequency of 1 kHz. The measurement results are shown in FIG. 12. In any of the butterfly curves of Examples 1 and 4, the difference between the lowest point and the highest point of the butterfly curve of Comparative Example 1 could be secured at the same level, and thus the displacement characteristics were found to be able to be enhanced. According to Example 1, the difference between the lowest point and the highest point was larger than in Comparative Example 1, and thus the displacement was confirmed to be able to be more improved than Comparative Example 1. Actually, as shown in Table 1, it was confirmed that in Example 1, the displacement can be more improved by approximately 30% than Comparative Example 1.

Other Embodiments

Although one embodiment of the invention has been described as above, the invention is not limited to the above description. For example, a silicon single crystal substrate has been exemplified as the channel forming substrate 10, but the channel forming substrate 10 is not particularly limited thereto. For example, a SOI substrate or a material such as glass may be used.

In the above-described Embodiment 1, the case in which the first electrode 60 configures an individual electrode and the second electrode 80 configures a common electrode has been described as an example. However, the first electrode 60 may be configured as a common electrode provided continuously in the direction in which the pressure generation chambers 12 are arranged, and the second electrode 80 may be configured as an individual electrode provided independently corresponding to the pressure generation chamber 12.

In the above-described Embodiment 1, the ink jet recording head has been described as an example of the liquid ejecting head. However, the invention is widely provided for general liquid ejecting heads and can also be applied to liquid ejecting heads which eject a liquid other than an ink. Examples of other liquid ejecting heads include various recording heads which are used in image recording apparatuses such as printers, color material ejecting heads which are used in the manufacturing of color filters of liquid crystal displays and the like, electrode material ejecting heads which are used in the formation of electrodes of organic EL displays and field emission displays (FED), and bioorganic material ejecting heads which are used in the manufacturing of biochips.

In addition, the piezoelectric element described in the above-described Embodiment 1 is not limited to piezoelectric elements used in liquid ejecting heads, and can also be used in other devices. Examples of other devices include ultrasonic measuring apparatuses. Such ultrasonic measuring apparatuses can be configured to have the above-described piezoelectric element 300 and control means for measuring a detection target using a signal based on at least one of an ultrasonic wave transmitted by the piezoelectric element 300 and an ultrasonic wave received by the piezoelectric element 300.

Furthermore, examples of other devices include various motors, temperature-electricity converters, pressure-electricity converters, ferroelectric transistors, piezoelectric transformers, and filters such as filters for shielding harmful rays such as infrared rays, optical filters using a photonic crystal effect caused by the formation of quantum dots, and optical filters using optical interference of a thin film. In addition, the invention can also be applied to piezoelectric elements which are used as a sensor and piezoelectric elements which are used as a ferroelectric memory. Examples of the sensor in which the piezoelectric element is used include infrared sensors, ultrasonic sensors, heat-sensitive sensors, pressure sensors, pyroelectric sensors, and gyro sensors (angular velocity sensors).

The piezoelectric element described in the above-described Embodiment 1 can also be appropriately used as a ferroelectric element. Examples of the ferroelectric element which can be appropriately used include ferroelectric transistors (FeFET), ferroelectric arithmetic circuits (FeLogic), and ferroelectric capacitors. Furthermore, the piezoelectric element described in the above-described Embodiment 1 can be appropriately used as a pyroelectric element since it exhibitions good pyroelectric characteristics. Examples of the pyroelectric element which can be appropriately used include temperature detectors, living body detectors, infrared detectors, terahertz detectors, and heat-electricity converters.

The invention claimed is:

1. A piezoelectric material which is expressed as a mixed crystal comprising:
   a first component formed of a complex oxide having a perovskite structure and a rhombohedral structure and containing Bi in an A-site and Fe in a B-site;
   a second component formed of a complex oxide having a perovskite structure and a tetragonal structure and containing Ba in an A-site and Ti in a B-site; and
   a third component formed of a complex oxide having a perovskite structure and a tetragonal structure and containing Bi and K in an A-site and Ti in a B-site,
   wherein the molar ratio (rhombohedral crystal/tetragonal crystal) of the complex oxide having a rhombohedral structure in the first component to the total complex oxides having a tetragonal structure in the second and third components is 75/25 to 55/45.

2. The piezoelectric material according to claim 1, wherein the first component has a composition expressed by the following Formula (1) with Mn contained in the B-site, the second component has a composition expressed by the following Formula (2), and the third component has a composition expressed by the following Formula (3), $$Bi(Fe,Mn)O_3 \quad (1)$$

$$BaTiO_3 \quad (2)$$

$$(Bi,K)TiO_3 \quad (3).$$

3. The piezoelectric material according to claim 1, wherein the content of the second component is 25 mol % to 35 mol %.

4. The piezoelectric material according to claim 1, wherein the content of the third component is 5 mol % to 20 mol %.

5. A piezoelectric element comprising:
   a first electrode;
   a piezoelectric layer made of piezoelectric material; and
   a second electrode stacked on a substrate, wherein the piezoelectric material is expressed as a mixed crystal including:
a first component formed of a complex oxide having a perovskite structure and a rhombohedral structure and containing Bi in an A-site and Fe in a B-site;
a second component formed of a complex oxide having a perovskite structure and a tetragonal structure and containing Ba in an A-site and Ti in a B-site; and
a third component formed of a complex oxide having a perovskite structure and a tetragonal structure and containing Bi and K in an A-site and Ti in a B-site,
wherein the molar ratio (rhombohedral crystal/tetragonal crystal) of the complex oxide having a rhombohedral structure in the first component to the total complex oxides having a tetragonal structure in the second and third components is 75/25 to 55/45.

6. The piezoelectric material according to claim 5, wherein the first component has a composition expressed by the following Formula (1) with Mn contained in the B-site, the second component has a composition expressed by the following Formula (2), and the third component has a composition expressed by the following Formula (3), $$Bi(Fe,Mn)O_3 \qquad (1)$$

$$BaTiO_3 \qquad (2)$$

$$(Bi,K)TiO_3 \qquad (3).$$

7. The piezoelectric material according to claim 5, wherein the content of the second component is 25 mol % to 35 mol %.

8. The piezoelectric material according to claim 5, wherein the content of the third component is 5 mol % to 20 mol %.

9. The piezoelectric element according to claim 5, wherein the piezoelectric layer is stacked on the first electrode via a seed layer formed of a complex oxide having a perovskite structure and containing Bi in an A-site and Mn in a B-site.

10. A liquid ejecting head comprising:
the piezoelectric element according to claim 5.

11. A liquid ejecting apparatus comprising:
the liquid ejecting head according to claim 10.

12. An ultrasonic measuring apparatus comprising:
the piezoelectric element according to claim 5; and
a controller configured to measure a subject using a signal based on at least one of an ultrasonic wave transmitted by the piezoelectric element and an ultrasonic wave received by the piezoelectric element.

13. The piezoelectric material according to claim 1, wherein the first component has a composition expressed by the following Formula (1), the second component has a composition expressed by the following Formula (2), and the third component has a composition expressed by the following Formula (3), $$Bi(Fe,Mn)O_3 \qquad (1)$$

$$BaTiO_3 \qquad (2)$$

$$(Bi,K)TiO_3 \qquad (3)$$

wherein the content of the first component is 55 mol % to 75 mol %, the content of the second component is 20 mol % to 35 mol %, and the content of the third component is 3 mol % to 20 mol %.

14. The piezoelectric element according to claim 5, wherein the first component has a composition expressed by the following Formula (1), the second component has a composition expressed by the following Formula (2), and the third component has a composition expressed by the following Formula (3), $$Bi(Fe,Mn)O_3 \qquad (1)$$

$$BaTiO_3 \qquad (2)$$

$$(Bi,K)TiO_3 \qquad (3)$$

wherein the content of the first component is 55 mol % to 75 mol %, the content of the second component is 20 mol % to 35 mol %, and the content of the third component is 3 mol % to 20 mol %.

* * * * *